(12) United States Patent
Kim et al.

(10) Patent No.: US 12,057,811 B2
(45) Date of Patent: Aug. 6, 2024

(54) SUPPLY MODULATOR PROVIDING MULTI-LEVEL SUPPLY VOLTAGE AND OPERATING METHOD THEREOF

(71) Applicant: SAMSUNG ELECTRONICS CO., LTD., Suwon-si (KR)

(72) Inventors: Dongsu Kim, Hwaseong-si (KR); Sungyoub Jung, Hwaseong-si (KR); Younghwan Choo, Daejeon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 407 days.

(21) Appl. No.: 17/513,488

(22) Filed: Oct. 28, 2021

(65) Prior Publication Data

US 2022/0224289 A1 Jul. 14, 2022

(30) Foreign Application Priority Data

Jan. 13, 2021 (KR) .................. 10-2021-0004929

(51) Int. Cl.
*H03F 1/02* (2006.01)
*H03F 3/24* (2006.01)

(52) U.S. Cl.
CPC .......... *H03F 1/0211* (2013.01); *H03F 3/245* (2013.01); *H03F 2200/451* (2013.01)

(58) Field of Classification Search
CPC .. H03F 1/0211; H03F 3/245; H03F 2200/451; H03F 2200/105; H03F 3/19; H03F 1/0227; G05F 1/56
USPC ......................................... 330/296–297, 136
See application file for complete search history.

(56) References Cited

U.S. PATENT DOCUMENTS

| 6,788,151 B2 | 9/2004 | Shvarts et al. |
| 8,600,321 B2 | 12/2013 | Nambu et al. |
| 8,829,993 B2 * | 9/2014 | Briffa ........................ H03F 3/68 330/136 |
| 8,897,724 B2 | 11/2014 | Hou |

(Continued)

FOREIGN PATENT DOCUMENTS

KR 10-2012-0070910 7/2012

OTHER PUBLICATIONS

Finite impulse response; https://en.wikipedia.org/wiki/Finite_impulse_response;Oct. 14, 2021.

(Continued)

*Primary Examiner* — Hieu P Nguyen
(74) *Attorney, Agent, or Firm* — F. Chau & Associates, LLC

(57) ABSTRACT

A supply modulator includes a multi-level voltage generator configured to generate a plurality of power voltages having different voltage levels; a switch array including a plurality of switches respectively corresponding to the plurality of power voltages, and outputting one of the plurality of power voltages by activating connection of one of the plurality of switches; and a switch controller configured to control connection of each of the plurality of switches and activate connection of at least one third switch distinguished from a first switch and a second switch in response to receiving a level control signal switching the connection from the first switch to the second switch during a time period corresponding to a frequency to be attenuated between disconnecting the first switch and connecting the second switch.

20 Claims, 13 Drawing Sheets

(56) References Cited

U.S. PATENT DOCUMENTS

| | | |
|---|---|---|
| 9,172,336 B2 | 10/2015 | Briffa et al. |
| 9,270,504 B2 | 2/2016 | Koike-Akino et al. |
| 9,768,731 B2 | 9/2017 | Perreault et al. |
| 10,090,808 B1 | 10/2018 | Henzler et al. |
| 10,193,500 B2 | 1/2019 | Kim et al. |
| 10,686,407 B2 | 6/2020 | Nomiyama et al. |
| 2019/0319720 A1 | 10/2019 | Ripley et al. |

OTHER PUBLICATIONS

LTE frequency bands; https://en.wikipedia.org/wiki/LTE_frequency_bands, Oct. 14, 2021.
5G Nr frequency bands; https://en.wikipedia.org/wiki/5G_NR_frequency_bands, Oct. 14, 2021.

* cited by examiner

FIG. 11

| ΔLevel | ΔV | MULTI-STEP | | | | | |
|---|---|---|---|---|---|---|---|
| | | TIME | | | | | |
| | | Equation | 30MHz | 45MHz | 55MHz | 80MHz | 120MHz |
| 1 | +1 | $T1=1/f_{NT}/10.74$ | 3.10ns | 2.07ns | 1.69ns | 1.16ns | 0.77ns |
| | -2 | $T2=1/f_{NT}/5.37$ | 6.21ns | 4.14ns | 3.39ns | 2.23ns | 1.55ns |
| | +2 | — | — | — | — | — | — |
| 2 | +1 | $T1=1/f_{NT}/2$ | 16.67ns | 11.11ns | 9.09ns | 6.25ns | 4.17ns |
| | +1 | — | — | — | — | — | — |
| | — | — | — | — | — | — | — |
| 3 | +1 | $T1=1/f_{NT}/3$ | 11.11ns | 7.41ns | 6.06ns | 4.17ns | 2.78ns |
| | +1 | $T2=1/f_{NT}/3$ | 11.11ns | 7.41ns | 6.06ns | 4.17ns | 2.78ns |
| | +1 | — | — | — | — | — | — |
| 4 | +2 | $T1=1/f_{NT}/2$ | 16.67ns | 11.11ns | 9.09ns | 6.25ns | 4.17ns |
| | +2 | — | — | — | — | — | — |
| | — | — | — | — | — | — | — |
| 5 | +2 | $T1=1/f_{NT}/3.45$ | 9.66ns | 6.44ns | 5.27ns | 3.62ns | 2.42ns |
| | +1 | $T2=1/f_{NT}/3.45$ | 9.66ns | 6.44ns | 5.27ns | 3.62ns | 2.42ns |
| | +2 | — | — | — | — | — | — |
| 6 | +3 | $T1=1/f_{NT}/2$ | 16.67ns | 11.11ns | 9.09ns | 6.25ns | 4.17ns |
| | +3 | — | — | — | — | — | — |
| | — | — | — | — | — | — | — |
| 7 | +2 | $T1=1/f_{NT}/2.6$ | 12.82ns | 8.55ns | 6.99ns | 4.81ns | 3.21ns |
| | +3 | $T2=1/f_{NT}/2.6$ | 12.82ns | 8.55ns | 6.99ns | 4.81ns | 3.21ns |
| | +2 | — | — | — | — | — | — |

FIG. 12

| Band IDX | Uplink(MHz) | Downlink(MHz) | Duplex spacing(MHz) |
|---|---|---|---|
| 1 | 1920-1980 | 2110-2170 | 190 |
| 2 | 1850-1910 | 1930-1990 | 80 |
| 3 | 1710-1785 | 1805-1880 | 95 |
| 4 | 1710-1755 | 2110-2155 | 400 |
| 5 | 824-849 | 869-894 | 45 |
| 6 | 2500-2570 | 2620-2690 | 120 |
| 7 | 880-915 | 925-960 | 45 |
| 8 | 1427.9-1447.9 | 1475.9-1495.9 | 48 |
| 9 | 698-716 | 728-746 | 30 |

SUPPLY MODULATOR PROVIDING MULTI-LEVEL SUPPLY VOLTAGE AND OPERATING METHOD THEREOF

CROSS-REFERENCE TO RELATED APPLICATION

This application claims priority under 35 U.S.C. § 119 to Korean Patent Application No. 10-2021-0004929, filed on Jan. 13, 2021, in the Korean Intellectual Property Office, the disclosure of which is incorporated by reference herein in its entirety.

FIELD

The present disclosure relates to a supply modulator, and more particularly, to a supply modulator that outputs multi-level power voltages.

DISCUSSION OF RELATED ART

In wireless communications devices such as smartphones, tablets, and Internet of Things (IoT) devices, telecommunications technologies such as Wideband Code Division Multiple Access (WCDMA) third-generation (3G), Long-Term Evolution (LTE), LTE Advanced fourth-generation (4G), or New Radio (NR) fifth-generation (5G) are used for high-speed communications. However, as communications technology develops, a high peak-to-average power ratio (PAPR) and a high bandwidth of a transmission/reception signal are used Therefore, when the power of a power amplifier for a transmitter is connected to a battery, the efficiency of the power amplifier is lowered. Accordingly, in order to track the power efficiency of a power amplifier at a high PAPR and a high bandwidth, average power tracking technology (hereinafter referred to as APT) or envelope tracking technology (hereinafter referred to as ET) may be used. A chip or component supporting such APT and ET is called a supply modulator (SM).

SUMMARY

The present disclosure relates to supply modulators, and more particularly relates to a supply modulator that minimizes noise, and an operating method thereof.

According to an embodiment of the present disclosure, a supply modulator is provided including: a multi-level voltage generator configured to generate a plurality of power voltages having different voltage levels; a switch array including a plurality of switches respectively corresponding to the plurality of power voltages, each switch switchably connected to an output terminal; and a switch controller configured to receive a level control signal indicative of switching the connection to the output terminal from a first switch to a second switch, and to connect at least one third switch to the output terminal during a time period corresponding to a frequency to be attenuated between disconnecting the first switch and connecting the second switch.

According to another embodiment of the present disclosure, a wireless communications device is provided including: a supply modulator configured to output any one of a plurality of power voltages of different voltage levels, and to output a power voltage of at least one third voltage level distinguished from the first voltage level and the second voltage level when the power voltage is changed from the first voltage level to the second voltage level during a time period corresponding to a frequency to be attenuated between a change from the first voltage level to the second voltage level; and a communications processor configured to control the supply modulator and determine at least one of the frequency to be attenuated and the time period.

According to another embodiment of the present disclosure, an operating method of a wireless communications device is provided for amplifying power of a communications signal based on a plurality of levels of power voltages including: determining a transition delay time based on a frequency to be attenuated when the power voltages transition from a first level to a second level from among the plurality of levels; outputting a power voltage of at least one of third levels distinguished from the first level and the second level during the transition delay time between transitioning from the first level to the second level; and amplifying power of the communications signal based on the power voltage.

BRIEF DESCRIPTION OF THE DRAWINGS

Embodiments of the present disclosure will be more clearly understood from the following detailed description taken in conjunction with the accompanying drawings, in which:

FIG. 11 is a tabular diagram of a delay time period in which a supply modulator according to an embodiment outputs a power voltage of a third level;

FIG. 12 is a tabular diagram of frequency characteristics for each frequency band for determining a frequency to be attenuated by a supply modulator of the inventive concept;

DETAILED DESCRIPTION

Hereinafter, embodiments of the present disclosure will be described in detail with reference to the accompanying drawings.

Figure 1:
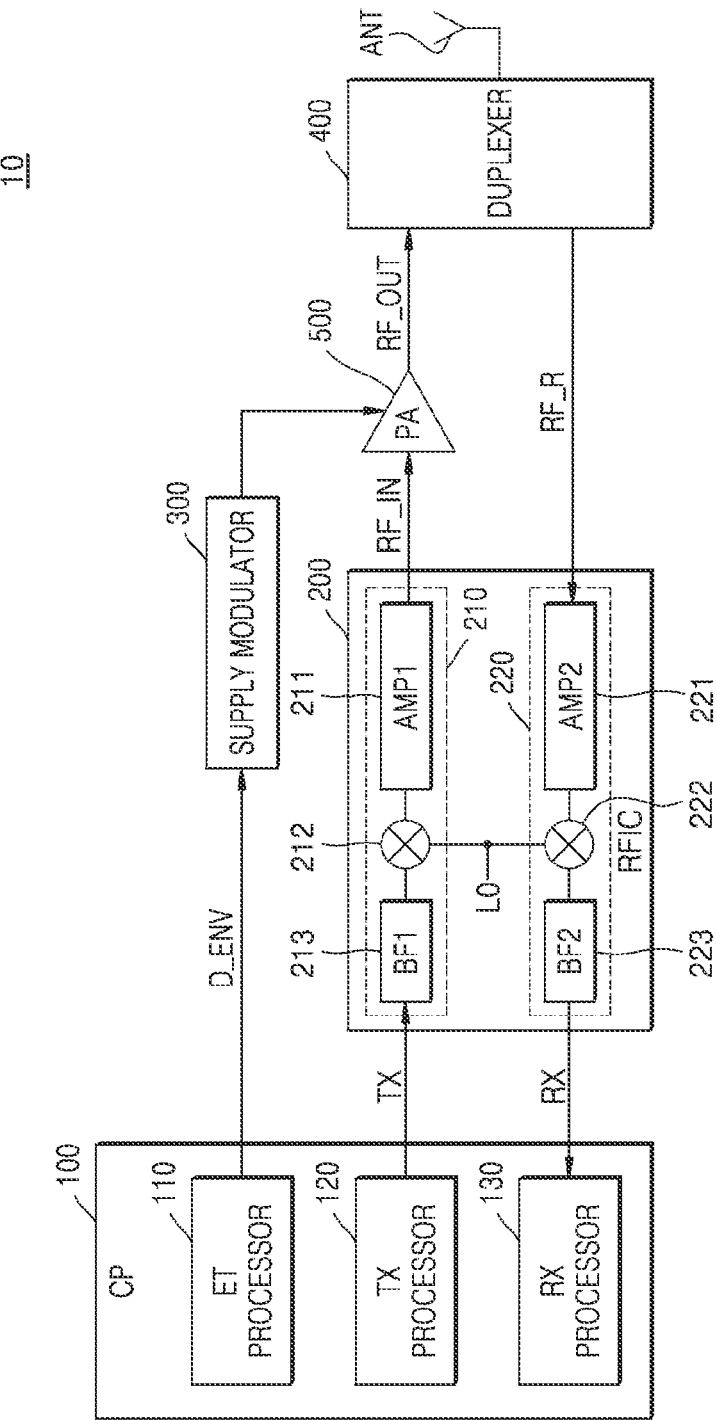
FIG. 1 is a block diagram of a wireless communications device according to an embodiment.

FIG. 1 illustrates a wireless communications device according to an embodiment.

Referring to FIG. 1, a wireless communications device 10, according to an embodiment, may include a communications processor (CP) 100, a radio-frequency integrated circuit (RFIC) 200, a supply modulator 300, a duplexer 400, a power amplifier (PA) 500, and an antenna ANT.

The communications processor 100 may include an envelope tracking (ET) processor 110, a transmission (TX) processor 120, and a reception (RX) processor 130. The communications processor 100 may process a baseband signal including information to be transmitted, such as an in-phase (I) signal and a quadrature (Q) signal, through the transmission processor 120 according to a certain communications method. In addition, the communications processor 100 may process the received baseband signal according to the certain communications method through the reception processor 130.

For example, the communications processor 100 may process a signal to be transmitted or a reception signal according to a communications method such as Orthogonal Frequency Division Multiplexing (OFDM), Orthogonal Frequency Division Multiple Access (OFDMA), Wideband Code Division Multiple Access (WCDMA), or High-Speed Packet Access+ (HSPA+). In addition, the communications processor 100 may process baseband signals according to various types of communications methods (e.g., various communications methods in which a technique for modulating or demodulating the amplitude and/or frequency of a baseband signal is applied).

The communications processor 100 may extract an envelope of the baseband signal through the envelope tracking processor 110, and generate a digital envelope signal D_ENV based on the extracted envelope. The extracted envelope may correspond to an amplitude component of the baseband signal (e.g., the magnitude of the I and Q signals)

The envelope tracking processor 110, the transmission processor 120, and the reception processor 130 of the communications processor 100 may be configured with different modules, respectively, to output signals. However, the envelope tracking processor 110, the transmission processor 120, and the reception processor 130 of the present disclosure are not limited thereto, and may be a processor configured as a single module to perform different functions.

The communications processor 100 may generate a transmission signal TX, which is an analog signal, by performing digital-to-analog conversion on each baseband signal using a plurality of digital-to-analog converters provided therein. The communications processor 100 may receive a reception signal RX that is an analog signal from the RFIC 200. The communications processor 100 may extract a baseband signal, which is a digital signal, by analog-to-digital converting the reception signal RX through an analog-to-digital converter (ADC) provided therein. The transmission signal TX and the reception signal RX may be differential signals including positive signals and negative signals.

The RFIC 200 may generate an RF input signal RF_IN by performing frequency up-conversion on the transmission signal TX, and/or may generate the reception signal RX by performing frequency down-conversion on an RF reception signal RF_R. In greater detail, the RFIC 200 may include a transmission circuit 210 for frequency up-conversion, a receiving circuit 220 for frequency down-conversion, and a local oscillator LO.

The transmission circuit 210 may include a first baseband filter 213, a first mixer 212, and a first amplifier 211. For example, the first baseband filter 213 may include a low-pass filter. The first baseband filter 213 may filter the transmission signal TX received from the communications processor 100 and provide the same to the first mixer 212. In addition, the first mixer 212 may perform a frequency up-conversion of converting a frequency of the transmission signal TX from a baseband to a high frequency band through a frequency signal provided by the local oscillator LO. Through such frequency up-conversion, the transmission signal TX may be provided to the first amplifier 211 as the RF input signal RF_IN, and the first amplifier 211 may primarily amplify the RF input signal RF_IN and provide the same to the power amplifier 500.

The power amplifier 500 may receive a power voltage from the supply modulator 300, and may generate an RF output signal RF_OUT by secondary amplification of the power of the RF input signal RF_IN based on the received power voltage. In addition, the power amplifier PA may provide the generated RF output signal RF_OUT to the duplexer 400. According to an embodiment, a power voltage output from a supply modulator may be a power voltage having any one of a plurality of discrete levels, without limitation.

The reception circuit 220 may include a second baseband filter 223, a second mixer 222, and a second amplifier 221. The second amplifier 221 may be, for example, a low noise amplifier including a low-pass filter. The second amplifier 221 may amplify the RF reception signal RF_R provided from the duplexer 400 and provide the same to the second mixer 222. In addition, the second mixer 222 may perform a frequency down-conversion of converting a frequency of the RF reception signal RF_R from a high frequency band to a baseband through a frequency signal provided by the local oscillator LO. Through such frequency down-conversion, the RF reception signal RF_R may be provided as the reception signal RX to the second baseband filter 223, and the second baseband filter 223 may filter the reception signal RX and provide the same to the communications processor 100.

For reference, the wireless communications device 10 may transmit and receive signals through a plurality of frequency bands using carrier aggregation (CA). In addition, the wireless communications device 10 may include a plurality of power amplifiers for amplifying power of a plurality of RF input signals respectively corresponding to a plurality of carrier waves. However, in this embodiment, for convenience of description, a single power amplifier 500 will be described as an example, without limitation thereto.

When a power voltage of a fixed level is applied to the power amplifier 500, the power efficiency of the power amplifier 500 may decrease. The supply modulator 300, according to an embodiment, may generate a modulated output voltage in which the level thereof is dynamically changed based on the digital envelope signal D_ENV, and may provide the modulated output voltage to the power amplifier 500 as a power voltage. Therefore, for efficient power management of the power amplifier 500, the supply modulator 300 may modulate an input voltage based on the digital envelope signal D_ENV, and may provide the modulated voltage to the power amplifier 500 as a power voltage.

The supply modulator 300, according to an embodiment, may attenuate noise for a specific frequency by outputting a third voltage level distinguished from a first voltage level and a second voltage level during a time period for a specific frequency to be attenuated in a case of transitioning a power voltage level from the first voltage level to the second voltage level. On the other hand, in a supply modulator according to a comparative embodiment, noise might be generated in a process of transitioning a power voltage level from a first voltage level having a discrete level to a second voltage level, and in a process of attenuating noise by a low-pass filter, signal loss might occur even in a frequency band excluding a specific frequency. A detailed description with respect to the supply modulator 300 may be described further below.

The duplexer 400 may be connected to the antenna ANT to separate a transmission frequency and a reception frequency. In more detail, the duplexer 400 may separate the RF output signal RF_OUT provided from the power amplifier 500 for each frequency band and provide the RF output signal RF_OUT to the corresponding antenna ANT. In addition, the duplexer 400 may provide an external signal RF_R received from the antenna ANT to the second amplifier 221 of the reception circuit 220 of the RFIC 200. For example, the duplexer 400 may include a front-end module with integrated duplexer (FEMiD).

In an alternate embodiment, the wireless communications device 10 may be equipped with a switch structure capable of separating a transmission frequency such as RF_OUT and a reception frequency such as RF_R instead of the duplexer 400. In addition, the wireless communications device 10 may be provided with a structure consisting of a duplexer 400 and a switch to separate the transmission frequency and the reception frequency. However, for convenience of explanation, in an embodiment, the duplexer 400 capable of separating a transmission frequency and a reception frequency is provided in the wireless communications device 10 as a non-limiting example.

The antenna ANT may transmit an RF output signal RF_OUT frequency-separated by the duplexer 400 to the outside or may provide an RF reception signal RF_R received from the outside to the duplexer 400. The antenna ANT may include, but is not limited to, an array antenna.

The communications processor 100, the supply modulator 300, the RFIC 200, the duplexer 400, and the power amplifier 500 may be individually implemented as ICs, chips, or modules. In addition, the communications processor 100, the supply modulator 300, the RFIC 200, the power amplifier 500, and the duplexer 400 may be mounted together on a printed circuit board (PCB). However, the present disclosure is not limited thereto, and in some embodiments, at least some of the communications processor 100, the supply modulator 300, the RFIC 200, the duplexer 400, and the power amplifier 500 may be implemented as a single communications chip.

In addition, the wireless communications device 10 illustrated in FIG. 1 may be included in a wireless communications system using a cellular network such as fifth-generation (5G), Long-Term Evolution (LTE), LTE-Advanced, and the like, or may be included in a Wireless Local Area Network (WLAN) system or any other wireless communications system. Although the configuration of the wireless communications device 10 shown in FIG. 1 is provided as an illustrative embodiment, the present disclosure is not limited thereto, and the wireless communications device 10 may be variously configured according to a communications protocol and/or a communications method.

Figure 2:
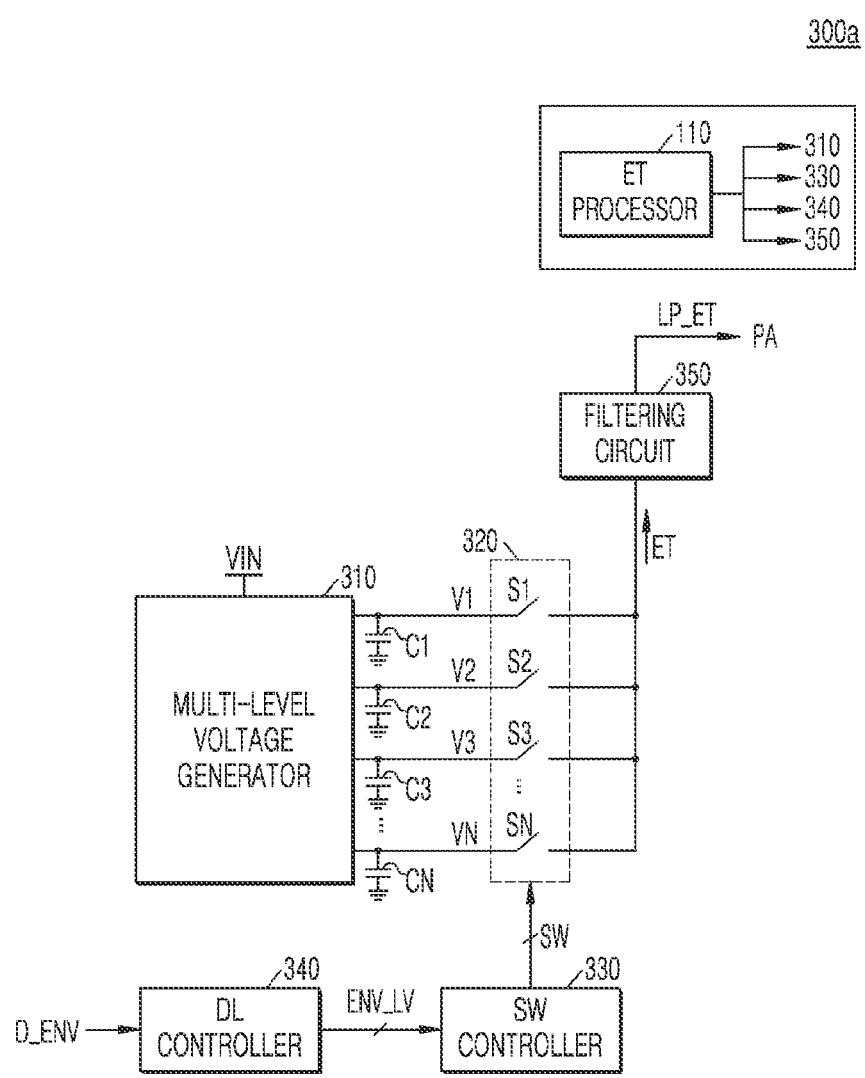
FIG. 2 is a circuit diagram of a supply modulator according to an embodiment.

FIG. 2 illustrates a supply modulator (SM) according to an embodiment. The supply modulator may be utilized as the supply modulator in the communications device of FIG. 1, but is not limited thereto.

Referring to FIG. 2, a supply modulator 300a according to an embodiment may include a multi-level voltage generator 310, a switch array 320, a switch (SW) controller 330, a discrete level (DL) controller 340, and a filtering circuit 350.

The multi-level voltage generator 310 may be controlled by a main controller to output a plurality of voltages of different levels V1 to VN, where N is a natural number of 2 or more. For example, the multi-level voltage generator 310 may increase or decrease an input voltage (e.g., power voltage in VIN supplied from a battery) based on a plurality of reference output voltage signals to generate and output the plurality of voltages of different levels V1 to VN. A method of outputting a plurality of voltages by the multi-level voltage generator 310 may be described in greater detail with reference to FIG. 3.

The plurality of reference output voltage signals may be provided from the envelope tracking processor 110. The communications processor 100 may calculate reference output voltage values based on output power of the power amplifier 500, may generate a plurality of reference output voltage signals based on the calculated reference output voltage values, and may provide the plurality of reference output voltage signals to the multi-level voltage generator 310.

In addition, the connection between the multi-level voltage generator 310 and the power amplifier 500 may be selectively opened and closed by the switch array 320. In other words, any one of the plurality of voltages of different levels V1 to VN (e.g., V1 to VN are generated and output in a time-division method) generated and output from the multi-level voltage generator 310 is selected by the opening/closing operation of the switch array 320 and the selected voltage may be provided to the power amplifier 500.

In addition, an output terminal of the multi-level voltage generator 310 may include a plurality of capacitors C1 to CN (N is a natural number of 2 or more) respectively corresponding to the plurality of voltages of different levels V1 to VN, and the connection between the plurality of capacitors C1 to CN and the power amplifier 500 may be individually opened and closed by a plurality of switches S1 to SN (where N is a natural number of 2 or more) in the switch array 320. However, the plurality of capacitors C1 to CN may be provided outside the multi-level voltage generator 310 instead of inside, without limitation. For convenience of explanation, in an embodiment, a description will be made by taking as an example that the plurality of capacitors C1 to CN are included in the multi-level voltage generator 310.

The switch array 320 may include the plurality of switches S1 to SN (where N is a natural number of 2 or more) respectively corresponding to the plurality of voltages of different levels V1 to VN output from the multi-level voltage generator 310. In addition, opening/closing operations of the plurality of switches S1 to SN in the switch array 320 may be controlled by a switch control signal SW provided from the switch controller 330. Accordingly, the switch array 320 may select one of the plurality of voltages of different levels V1 to VN based on the switch control signal SW and provide the same to the power amplifier 500.

According to an embodiment, each of the switches of the switch array 320 is connected to each output terminal, respectively, for outputting a plurality of voltages from the multi-level voltage generator 310, and activation of any one of the plurality of switches may be determined according to the switch control signal SW of the switch controller 330. For example, when the switch control signal SW for activating a switch S3 in a third column of the switch array 320 is received, a voltage V3 of a third level may be output.

The discrete level (DL) controller 340 may be controlled by the envelope tracking processor 110, and the discrete level controller 340 may generate a level control signal ENV_LV including envelope level information based on the digital envelope signal D_ENV provided from the outside. In greater detail, the discrete level controller 340 may receive the digital envelope signal D_ENV from the communications processor 100, and may generate and output the level control signal ENV_LV including portions of envelope level information based on the received digital envelope signal D_ENV. In addition, the output level control signal ENV_LV may be provided to the switch controller 330.

The switch controller 330 may receive the level control signal ENV_LV from the discrete level controller 340 and control the opening/closing operations of the plurality of switches S1 to SN based on the received level control signal ENV_LV. Accordingly, the switch controller 330 may generate the switch control signal SW for controlling an opening/closing operation of the switch array 320 and provide the generated switch control signal SW to the switch array 320. In addition, the switch controller 330 may be controlled by the envelope tracking processor 110 or the like.

The filtering circuit 350 may cancel noise by filtering a power voltage ET output from the multi-level voltage generator 310. For example, the filtering circuit 350 may include a low-pass filter formed of a combination of an inductor and a capacitor. The filtering circuit 350 may provide, to the power amplifier 500, a low frequency power voltage LP_ET from which high frequency noise of a power voltage has been cancelled.

In addition to the above-described configurations, the supply modulator 300a according to an embodiment may further include an additional capacitor, an oscillator, a bandgap reference circuit, and the like.

In greater detail, the additional capacitor may be connected near an output terminal of the supply modulator 300a, and may cancel parasitic capacitance and high frequency noise that may be in a circuit of the supply modulator 300a. The oscillator may be included in a circuit using an NMOS structure (e.g., a gate-boosted NMOS structure) to adjust characteristics of the switches S1 to SN. The bandgap reference circuit is a circuit that may supply a reference voltage or a reference current when each component operates, and may be substantially unaffected by process, voltage, and temperature changes.

As such, the supply modulator 300a may have the above-described configuration and characteristics. In addition, based on the above-described configuration and characteristics, the supply modulator 300a may provide any one of a plurality of power voltage levels to the power amplifier 500 by tracking an envelope.

A supply modulator according to a comparative embodiment may generate any one of a plurality of levels of power voltage, and may supply power voltages of discrete levels, similar to a continuous envelope, to a power amplifier according to whether a switch corresponding to each level is opened or closed. In this case, the supply modulator that outputs one of a plurality of levels of power voltage might cause an output voltage to rapidly transition and thus output a high level of noise. Because such a noise characteristic might degrade the performance of a Frequency Division Duplex (FDD) communications system, the supply modulator may produce a noise-cancelled supply voltage. According to a comparative embodiment, the supply modulator might cancel noise with a passive filter having a high attenuation characteristic, and when noise is cancelled by such a passive filter, a large power loss might occur in a power voltage.

In contrast, the supply modulator 300a, according to an embodiment, may output a power voltage of at least one third level distinguished from a first level and a second level during at least one delay time period before a power voltage transitions from the first level to the second level. Accordingly, the supply modulator 300a of the present disclosure may generate a power voltage having a low noise characteristic without significant power loss.

Figure 3:
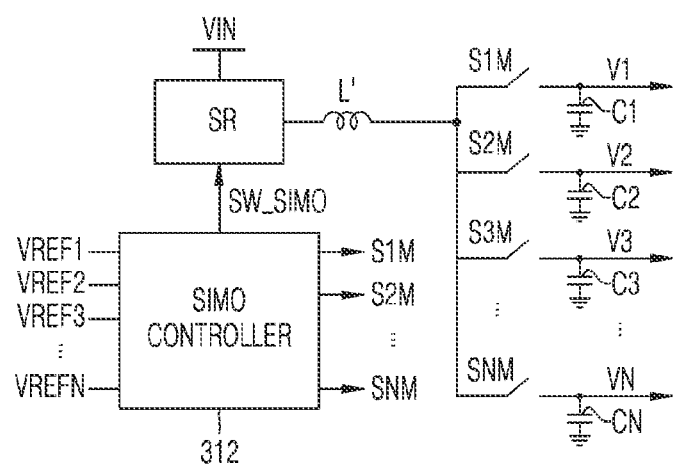
FIG. 3 is a circuit diagram of a multi-level voltage generator according to an embodiment.

FIG. 3 illustrates a multi-level voltage generator according to an embodiment. The multi-level voltage generator may be utilized as the multi-level voltage generator in the communications device of FIGS. 1 and 2, but is not limited thereto.

The multi-level voltage generator 310 may include, for example, a Single-Inductor Multiple-Output (SIMO) DC-DC Converter or a SIMO buck-boost converter.

In greater detail, the multi-level voltage generator 310 of FIG. 3 may have a structure in which an output current of a switching regulator (SR) in the SIMO DC-DC converter or the SIMO buck-boost converter is supplied to each output terminal through a single inductor L' in a time-division manner.

A SIMO controller 312 may monitor a difference between each of the output voltages V1 to VN and each of reference output voltage signals VREF1 to VREFN corresponding thereto, and may determine which of switches S1M, S2M, . . . , SNM connecting the inductor L' to each of the output voltages V1 to VN to turn on based on a result of the monitoring. The SIMO controller 312 may determine a switching input SW_SIMO of the SR connected to one side of the inductor L' based on information about the difference between each of the output voltages V1 to VN and each of the reference output voltage signals VREF1 to VREFN corresponding thereto.

The multi-level voltage generator 310 according to the embodiment of FIG. 3 generates a plurality of output voltages with one inductor, but is not limited thereto. The multi-level voltage generator 310 may include multiple embodiments for outputting a plurality of levels of power voltages to a plurality of output terminals by decreasing or increasing an input voltage.

Figure 4:
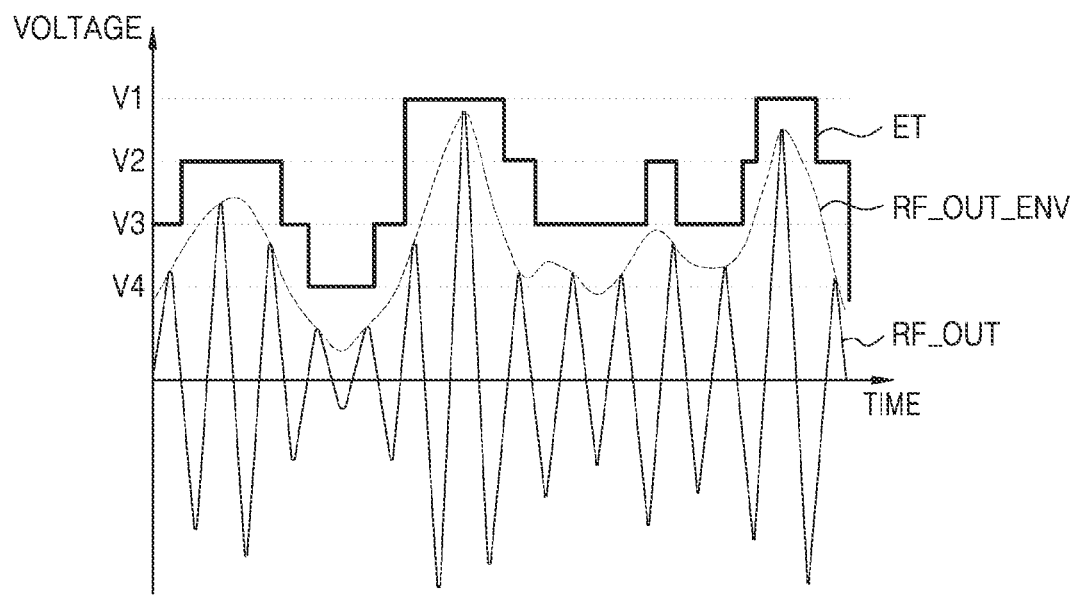
FIG. 4 is a graphical diagram illustrating an example of discretely generating multi-level output voltages according to an envelope tracking result.

FIG. 4 illustrates an example of generating discrete multi-level output voltages according to an envelope tracking result.

Referring to FIG. 4, the supply modulator 300a of the present disclosure may output a power voltage of any one of a plurality of discrete levels based on a voltage level of an envelope. The communications processor 100 may track an envelope RF_OUT_ENV for a transmission signal RF_OUT, and the supply modulator 300a may determine the level of a power voltage supplied to the power amplifier 500 based on a voltage level of the tracked envelope RF_OUT_ENV.

According to a comparative embodiment, an analog supply modulator may output the continuous power voltage ET according to the voltage level of the envelope RF_OUT_ENV. The analog supply modulator combines a linear amplifier and a switch amplifier in parallel for good linearity. With an analog supply modulator having such a structure, it might be impractical to increase efficiency significantly due to structural limitations, and/or it might be impractical to speed up due to process limitations.

On the other hand, the supply modulator 300a of the present disclosure may output a discrete-level power voltage ET, and may output a plurality of levels of power voltages ET with a non-complex structure, compared to the analog supply modulator of the comparative embodiment. A noise voltage might be generated due to a sudden voltage change in a process of transitioning the power voltage ET from a first level to a second level.

According to an embodiment, when a transmission signal and/or a reception signal is amplified in the power amplifier 500, interference may occur in the transmission signal and/or the reception signal due to noise of the power voltage ET, and to mitigate the interference of the transmission signal and/or the reception signal, noise of a specific frequency corresponding to a frequency of the transmission signal and/or the reception signal may be attenuated. For example, when the frequency of the transmission signal and/or the reception signal is 30 MHz, the supply modulator 300a may output a power voltage of a third level during a delay time period corresponding to 30 MHz in order to cancel noise of 30 MHz. Hereinafter, embodiments in which the supply modulator 300a cancels noise of a specific frequency according to a voltage level difference will be described.

Figure 5:
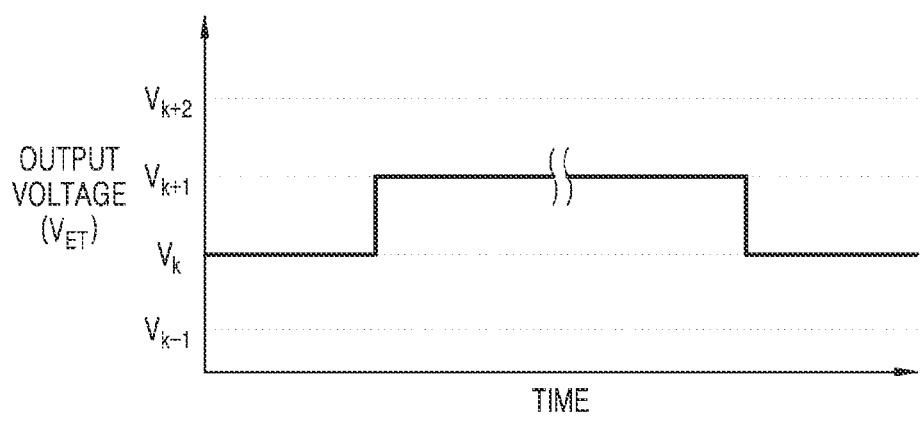
FIG. 5 is a graphical diagram illustrating an example in which a supply modulator of a comparative embodiment generates a transition voltage of one level difference.
Figure 6A:
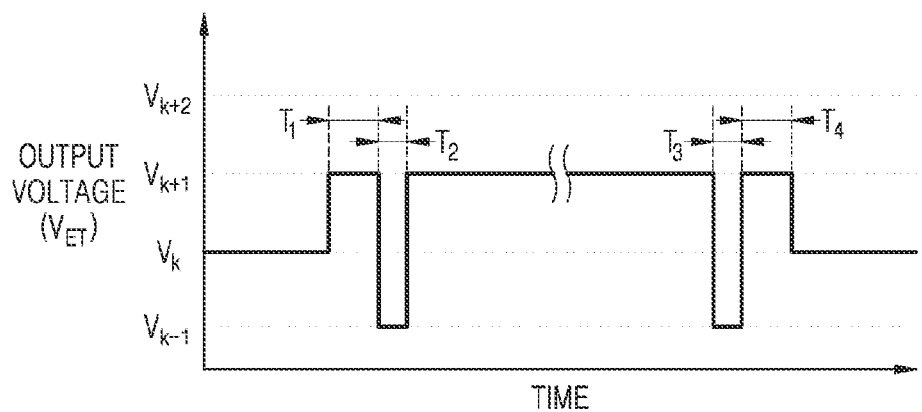
FIGS. 6A and 6B are graphical diagrams illustrating an example in which a supply modulator according to an embodiment generates a transition voltage of one level difference.
Figure 6B:
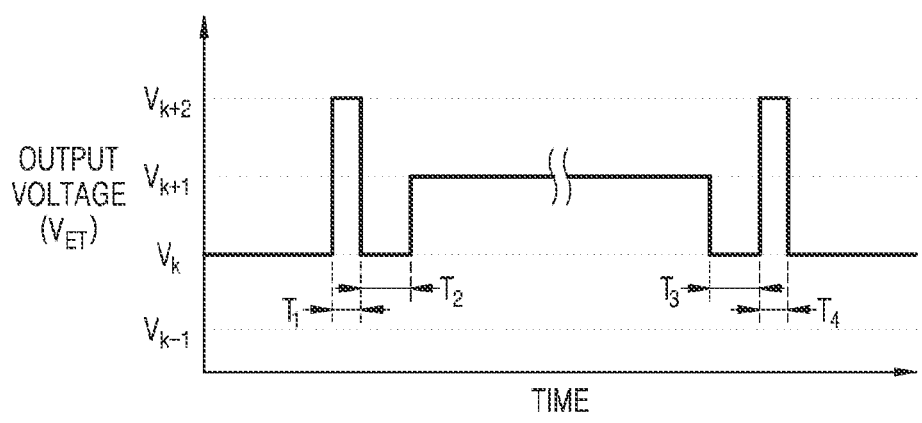

FIG. 5 illustrates an example in which the supply modulator 300a of a comparative example generates a transition voltage of one level difference, and FIGS. 6A and 6B illustrate an example in which the supply modulator 300a according to an embodiment generates a transition voltage of substantially one level difference.

Referring to FIG. 5, a difference between a first level of a power voltage before transition and a second level of a power voltage after transition is one level, and the supply modulator according to the comparative embodiment may discontinuously increase or decrease the power voltage from the first level to the second level. At this time, the supply modulator according to the comparative example generates a noise signal having a large voltage level by rapidly increasing or decreasing the power voltage. A level of a power voltage to be described further below may include discrete levels that are discretely divided.

The supply modulator 300a according to an embodiment may provide a power voltage from which a noise signal of a specific frequency is attenuated to the power amplifier 500 that amplifies a transmission/reception signal. The supply modulator 300a may cancel a noise signal of a specific frequency by generating a power voltage of a third level distinguished from the first level and the second level for a certain period of time.

Referring to FIG. 6A, the supply modulator 300a may output a power voltage of a third level $V_{K-1}$ for a certain period of time before increasing from a power voltage of a first level $V_K$ to a power voltage of a second level $V_{K+1}$. The supply modulator 300a according to an embodiment may output the power voltage of the first level $V_K$ or the second level $V_{K+1}$ during a delay time period that is distinguished from a delay time period in which the power voltage of the third level $V_{K-1}$ is output.

According to FIG. 6A, when a difference between the first level $V_K$ and the second level $V_{K+1}$ is one level, the supply modulator 300a may output the power voltage of the second level $V_{K+1}$ before or after outputting the power voltage of the third level $V_{K-1}$ for a certain period of time. That is, when increasing a power voltage from the first level $V_K$ to the second level $V_{K+1}$, the supply modulator 300a may output the power voltage of the second level $V_{K+1}$ during a first delay time period $T_1$, and may output the power voltage of the third level $V_{K-1}$ during a second delay time period $T_2$. After the second delay time period $T_2$, the voltage of the supply modulator 300a is increased by one level by outputting the second level $V_{K+1}$, and may output a power voltage in which noise of a specific frequency is attenuated due to a delay time period. The supply modulator 300a of the present disclosure may output the power voltage of the third level $V_{K-1}$ during different delay time periods for each specific frequency to attenuate noise of a specific frequency, without limitation thereto.

According to FIG. 6A, when decreasing a power voltage from the second level $V_{K+1}$ to the first level $V_K$, the supply modulator 300a may output the power voltage of the third level $V_{K-1}$ during a third delay time period $T_3$, and may output the power voltage of the second level $V_{K+1}$ during a fourth delay time period $T_4$. After the fourth delay time period $T_4$, the voltage of the supply modulator 300a is decreased by one level by outputting the first level $V_K$, and may output a power voltage in which noise of a specific frequency is attenuated due to a delay time period, without limitation thereto.

According to the embodiment of FIG. 6B, the supply modulator 300a may increase or decrease a power voltage from the first level to the second level in a manner different from that of FIG. 6A. Duplicate description may be omitted.

According to FIG. 6B, when a difference between the first level $V_K$ and the second level $V_{K+1}$ is one level, the supply modulator 300a may output the power voltage of the first level $V_K$ before or after outputting a power voltage of a third level $V_{K+2}$ for a certain period of time. That is, when increasing a power voltage from the first level $V_K$ to the second level $V_{K+1}$, the supply modulator 300a may output the power voltage of the third level $V_{K+2}$ during the first delay time period $T_1$, and may output the power voltage of the first level $V_K$ during the second delay time period $T_2$. After the second delay time period $T_2$, the voltage of the supply modulator 300a is increased by one level by outputting the second level $V_{K+1}$, and may output a power voltage in which noise of a specific frequency is attenuated due to a delay time period. The supply modulator 300a of the present disclosure may output the power voltage of the third level $V_{K+2}$ during different delay time periods for each specific frequency in order to attenuate noise of a specific frequency.

According to FIG. 6B, when decreasing a power voltage from the second level $V_{K+1}$ to the first level $V_K$, the supply modulator 300a may output the power voltage of the first level $V_K$ during the third delay time period $T_3$, and may output the power voltage of the third level $V_{K+2}$ during the fourth delay time period $T_4$. After the fourth delay time period $T_4$, the voltage of the supply modulator 300a is decreased by one level by outputting the first level $V_K$, and may output a power voltage in which noise of a specific frequency is attenuated due to a delay time period, without limitation thereto.

FIG. 6A illustrates a case where a third level $V_{K-1}$ of a power voltage output by the supply modulator 300a is less than the first level $V_K$ and the second level $V_{K+1}$, and FIG. 6B illustrates a case where a third level $V_{K+2}$ is greater than the first level $V_K$ and the second level $V_{K+1}$. The supply modulator 300a of the present disclosure may output a power voltage according to FIG. 6A when the supply modulator 300a is able to output a power voltage at a level less than the first level $V_K$ and the second level $V_{K+1}$, and may output a power voltage according to FIG. 6B when the supply modulator 300a is able to output a power voltage at a level greater than the first level $V_K$ and the second level $V_{K+1}$, without limitation thereto.

Figure 7:
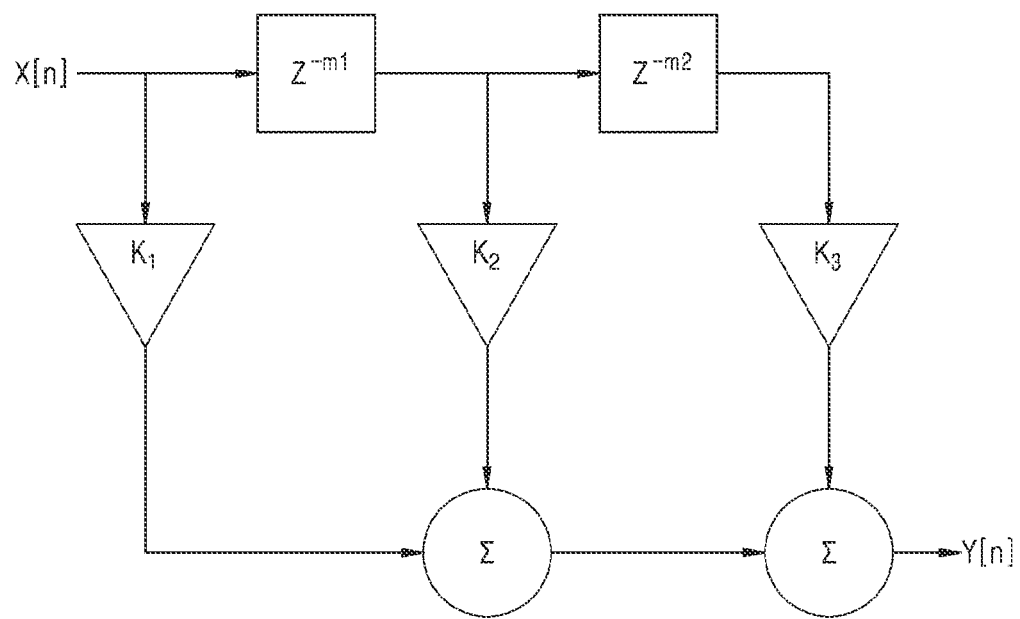
FIG. 7 is a block diagram of a transfer function in which a noise component of a specific frequency is attenuated by outputting a power voltage during a delay time period by a supply modulator according to an embodiment.

FIG. 7 illustrates a Z-transform transfer function in which a noise component of a specific frequency is attenuated by outputting a power voltage during a delay time period by the supply modulator 300a according to an embodiment.

When a power voltage of a third level is output during at least one delay time period, the power voltage output from the supply modulator 300a may be output after a specific frequency is attenuated through finite impulse response (FIR) filtering. A transfer function of an FIR filter for filtering a power voltage may be as set forth below in Equation 1.

$$H(z)=K_1+K_2*Z^{-m1}+K3*Z^{-m1-m2} \quad \text{[Equation 1]}$$

Here, $K_1$, $K_2$, and $K_3$ (where $K_1$, $K_2$, and $K_3$ are real numbers) may correspond to a level difference with a transition power voltage, and m1 and m2 (where m1 and m2 are natural numbers), which are indices of the Z term, may correspond to a length of the delay time period. For example, when there are a plurality of delay time periods, a ratio between the delay time periods may be a ratio of m1 and m2 (where m1 and m2 may each be constant term indexes).

In addition, m1 and m2 may correspond to the number of delay time periods activated during transition from a first level to a second level. When one delay time period is present, the transfer function of the FIR filter may be as shown below in Equation 2.

$$H(z)=K1+K2*Z^{-m1} \quad \text{[Equation 2]}$$

For example, referring to FIG. 6A, when transitioning from the first level to the second level, the supply modulator 300a may output the power voltage of the second level during the first delay time period $T_1$, and may output the power voltage of the third level during the second delay time period $T_2$. Accordingly, the supply modulator 300a according to FIG. 6A has filtering characteristics according to Equation 1. In the transfer function of Equation 1, the constant term denotes a characteristic when transitioning from the first level to the second level of the first delay time period $T_1$, the $Z^{-m1}$ term denotes a characteristic when transitioning from the second level of the first delay time period $T_1$ to the third level of the second delay time period $T_2$, and the $Z^{-m1-m2}$ term denotes a characteristic when transitioning from the third level of the second delay time period $T_2$ to the second level.

Referring to FIG. 6A, a length of the first delay time period $T_1$ may be twice a length of the second delay time period $T_2$, and thus, a difference between 0 and m1, which are indices of the constant term, may be twice a difference between m1 and m2. For example, when m1 is 2, m2 may be 1. $K_1$, $K_2$, and $K_3$ may correspond to differences with a voltage level before transition. For example, $K_1$ may be 1 because it is a difference between the second level and the first level, $K_2$ is −2 because it is a difference between the third level and the second level, and $K_3$ may be 2 because it is a difference between the second level and the third level. Therefore, a transfer function according to FIG. 6A may be as in Equation 3 below.

$$H(z)=1-2*Z^{-2}+2*Z^{-3} \quad \text{[Equation 3]}$$

In the same way, the transfer function of the supply modulator 300a having a delay time period of FIG. 6B may be as shown in Equation 4 below.

$$H(z)=2-2*Z^{-1}+1*Z^{-3} \quad \text{[Equation 4]}$$

In this case, a length of the delay time period may vary depending on a frequency to be attenuated, which will be described with reference to FIG. 11.

Figure 8:
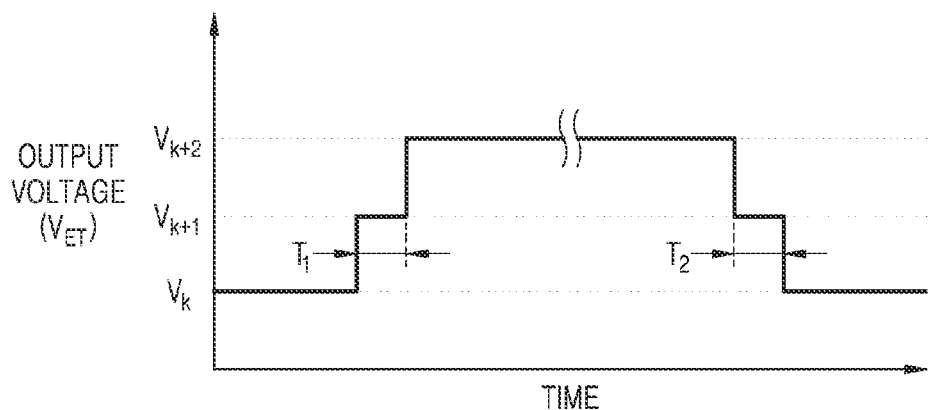
FIG. 8 is a graphical diagram illustrating an example in which a supply modulator according to an embodiment generates a transition voltage of a difference of two levels.

FIG. 8 illustrates an example in which the supply modulator 300a according to an embodiment generates a transition voltage of a difference of two levels.

Referring to FIG. 8, when a difference between a first level of a power voltage before transition and a second level of a power voltage after transition is 2 levels, the supply modulator 300a may output a power voltage of a third level $V_{K+1}$ that is distinguished from the first level $V_K$ and a second level $V_{K+2}$ for a certain period of time. According to an embodiment, the supply modulator 300a may output a power voltage by setting an intermediate level between the first level $V_K$ and the second level $V_{K+2}$ as the third level $V_{K+1}$. When a power voltage is output with the intermediate level between the first level $V_K$ and the second level $V_{K+2}$ as the third level $V_{K+1}$, charging and discharging losses due to capacitors connected to respective switches of a switch array may be minimized, compared to a case in which a level different from the intermediate level is set to the third level.

The supply modulator 300a according to an embodiment may provide a power voltage from which a noise signal of a frequency to be attenuated is attenuated to the power amplifier 500 that amplifies a transmission and/or reception signal by outputting the power voltage of the third level $V_{K+1}$ during a delay time period, Referring to FIG. 8, when increasing a power voltage from the first level $V_K$ to the second level $V_{K+2}$, the supply modulator 300a may output the power voltage of the third level $V_{K+1}$, which is the intermediate level between the first level $V_K$ and the second level $V_{K+2}$, during the first delay time period $T_1$ before outputting the power voltage of the second level. Accordingly, the supply modulator 300a may output a power voltage delayed by a delay time period, and the delayed power voltage may be a power voltage obtained by filtering a specific frequency component of the power voltage by the FIR filter of FIG. 7.

Referring to FIG. 7, the supply modulator 300a may have one delay time period in a process of increasing or decreasing a power voltage from the first level $V_K$ to the second level $V_{K+2}$. Accordingly, the supply modulator 300a that outputs the power voltage of FIG. 8 may have filtering characteristics according to a transfer function of Equation 2. For example, the transfer function according to FIG. 8 may be as in Equation 5 below.

$$H(z)=\tfrac{1}{2}+\tfrac{1}{2}*Z^{-1} \quad \text{[Equation 5]}$$

The supply modulator 300a having a filtering characteristic of Equation 5 may attenuate one frequency component in a process of transitioning a power voltage by a difference of two levels, and a delay time period may be adjusted according to a frequency to be attenuated.

Figure 9:
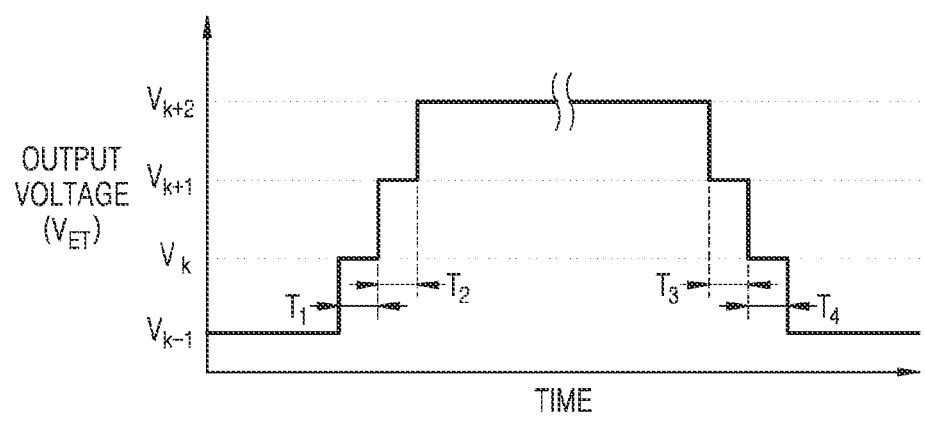
FIG. 9 is a graphical diagram illustrating an example in which a supply modulator according to an embodiment generates a transition voltage of a difference of three levels.

FIG. 9 illustrates an example in which the supply modulator 300a according to an embodiment generates a transition voltage of a difference of three levels.

Referring to FIG. 9, when a difference between a first level $V_{K-1}$ of a power voltage before transition and the second level $V_{K+2}$ of a power voltage after transition is three levels, the supply modulator 300a may output a power voltage of a third level that is distinguished from the first level $V_{K-1}$ and the second level $V_{K+2}$ for a certain period of time. According to an embodiment, the supply modulator 300a may output power voltages by setting a plurality of intermediate levels between the first level $V_{K-1}$ and the second level $V_{K+2}$ as the third levels $V_K$ and $V_{K+1}$. When the plurality of intermediate levels are output as the third levels $V_K$ and $V_{K+1}$, there may be a plurality of delay time periods.

The supply modulator 300a according to an embodiment may provide a power voltage from which a noise signal of a frequency to be attenuated is attenuated to the power amplifier 500 that amplifies a transmission/reception signal by outputting the power voltages of the plurality of third levels $V_K$ and $V_{K+1}$ during a plurality of delay time periods, Referring to FIG. 9, when increasing a power voltage from the first level $V_{K-1}$ to the second level $V_{K+2}$, the supply modulator 300a may output the power voltages of third levels $V_K$ and $V_{K+1}$ during the first delay time period $T_1$ and the second delay time period $T_2$ before outputting the power voltage of the second level $V_{K+2}$. Accordingly, the supply modulator 300a may output a power voltage delayed by the first delay time period $T_1$ and the second delay time period $T_2$, and the delayed power voltage may be a power voltage obtained by filtering a specific frequency component of the power voltage by the FIR filter of FIG. 7.

Referring to FIG. 7, the supply modulator 300a may have two delay time periods in a process of increasing or decreasing a power voltage from the first level $V_{K-1}$ to the second level $V_{K+2}$. Accordingly, the supply modulator 300a that outputs the power voltage of FIG. 9 may have filtering characteristics according to the transfer function of Equation 1. For example, the transfer function according to FIG. 9 may be as in Equation 6 below.

$$H(z)=1/3+1/3*Z^{-1}+1/3*Z^{-2} \qquad \text{[Equation 6]}$$

The supply modulator 300a having a filtering characteristic of Equation 6 may attenuate a frequency component corresponding to a frequency to be attenuated in a process of transitioning a power voltage by a difference of three levels, and a delay time period may be adjusted according to the frequency to be attenuated.

FIGS. 10A to 10D illustrate frequency characteristics of power voltages output according to the supply modulator 300a of the present disclosure.

Figure 10A:
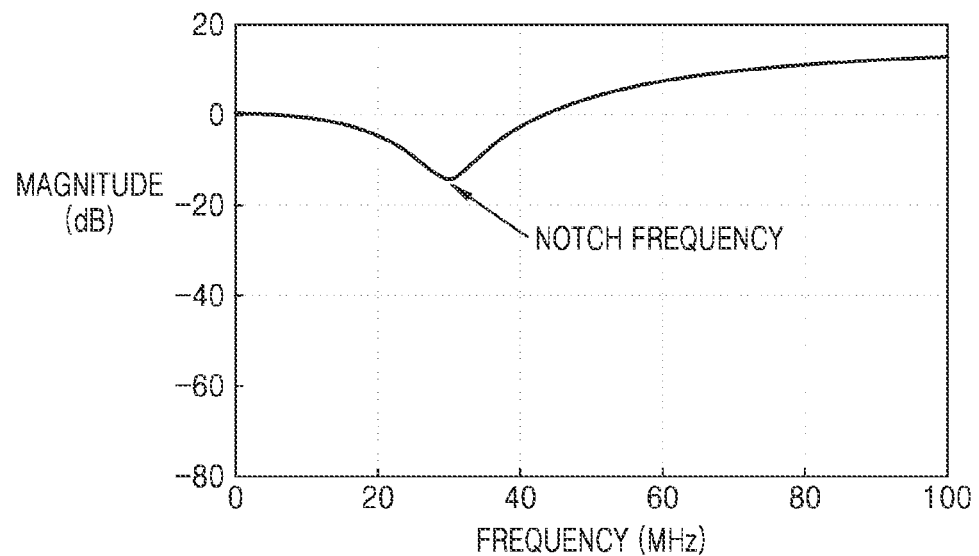
FIGS. 10A to 10D are graphical diagrams illustrating frequency characteristics of power voltages output according to a supply modulator of the inventive concept.
Figure 10B:
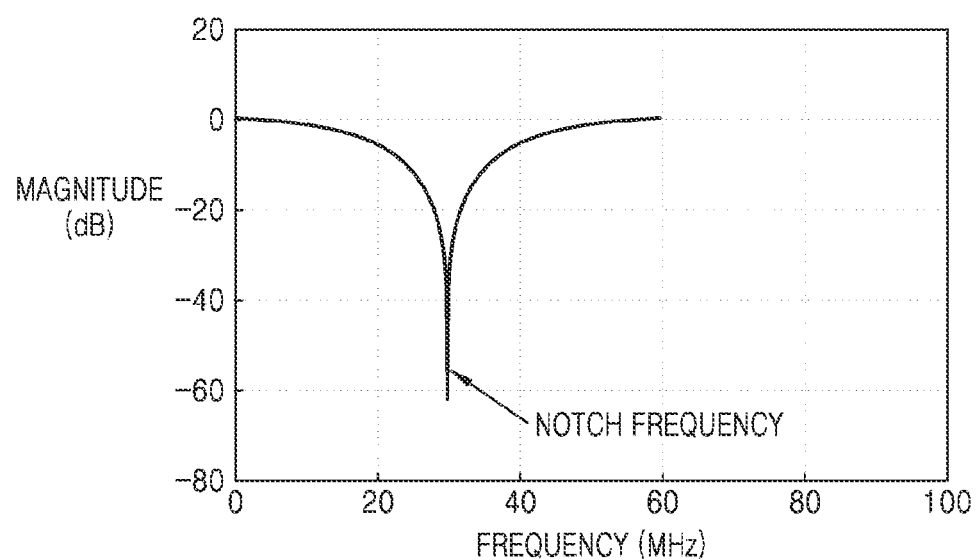
Figure 10C:
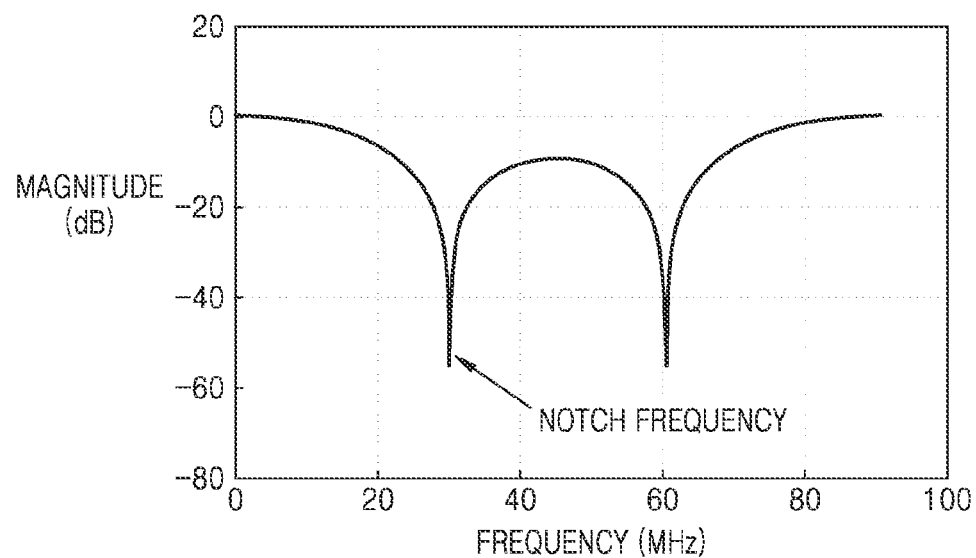
Figure 10D:
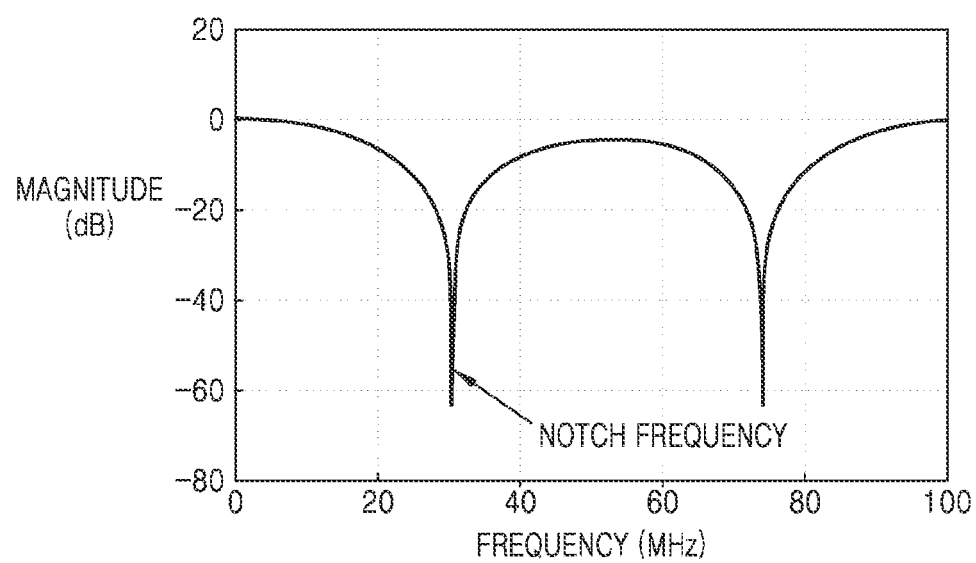

In more detail, FIG. 10A may be a graph illustrating a frequency characteristic of a power voltage when the supply modulator 300a outputs a power voltage of a third level according to FIG. 6 and transitions the power voltage by one level, and FIG. 10B may be a graph illustrating a frequency characteristic of a power voltage when the supply modulator 300a outputs a power voltage of a third level according to FIG. 8 and transitions the power voltage by even levels including two levels. FIGS. 10C and 10D may be graphs illustrating frequency characteristics of power voltages in a case of transitioning the power voltages by 3 levels and 5 levels, respectively.

The supply modulator 300a of the present disclosure may have an FIR filter characteristic in which an output of a specific frequency is attenuated by outputting a power voltage of a third level during at least one delay time period. Filtering characteristics filtered by the supply modulator 300a may be determined by the number and length of delay time periods, a difference between a first level to a third level, and a transfer function such as Equations 1 to 6. In this case, a frequency at which an absolute value of the transfer function is minimum may be a frequency to be attenuated.

FIG. 11 illustrates a delay time period in which the supply modulator 300a according to an embodiment outputs a power voltage of a third level.

Referring to FIG. 11, the supply modulator 300a may output the power voltage of the third level during different delay time periods according to a frequency to be attenuated. The delay time period may be inversely proportional to a frequency to be attenuated $f_{NT}$, and the frequency to be attenuated $f_{NT}$ may be determined according to a difference between a first level and a second level. According to an embodiment, the frequency to be attenuated $f_{NT}$ may be a frequency at which an absolute value of a transfer function is minimum.

The supply modulator 300a of the present disclosure may output the power voltage of the third level during a delay time period that is inversely proportional to the frequency to be attenuated. For example, when the difference between the first level and the second level is two levels, and the frequency to be attenuated is about 30 MHz, the delay time period may be about 16.67 ns. In this case, when the frequency to be attenuated is changed to about 45 MHz, the delay time period may be changed to about 11.11 ns.

FIG. 12 illustrates frequency characteristics for each frequency band for determining a frequency to be attenuated by the supply modulator 300a of the present disclosure.

A wireless communications device including the supply modulator 300a may determine a frequency to be attenuated according to the frequency band to be transmitted/received. Referring to FIG. 12, the frequency to be attenuated of the present disclosure may correspond to a duplex spacing frequency. The duplex spacing frequency may be a difference between an uplink frequency and a downlink frequency. In more detail, the duplex spacing frequency may be a difference between a minimum value of an uplink frequency band and a minimum value of a downlink frequency band, or a difference between a maximum value of the uplink frequency band and a maximum value of the downlink frequency band.

Referring to FIG. 12, when the wireless communications device transmits and receives a signal through a channel corresponding to a fifth band index, the frequency to be attenuated may be set to about 45 MHz. A channel corresponding to each band index may be referred to as a communications channel allocated to a frequency band preset by a communications protocol. Referring to FIG. 11, when the supply modulator 300a transitions a power voltage from a first level to a second level that differs by one level, the first delay time period $T_1$ may be about 2.07 ns, and the second delay time period $T_2$ may be about 4.14 ns. A memory of the wireless communications device may store the tables of FIGS. 11 and 12, but the wireless communications device of the present disclosure is not limited thereto. A duplex spacing frequency corresponding to the band index of FIG. 12 is stored by the memory, and a delay time period according to each duplex spacing frequency may be calculated by a processor of the wireless communications device.

Figure 13:
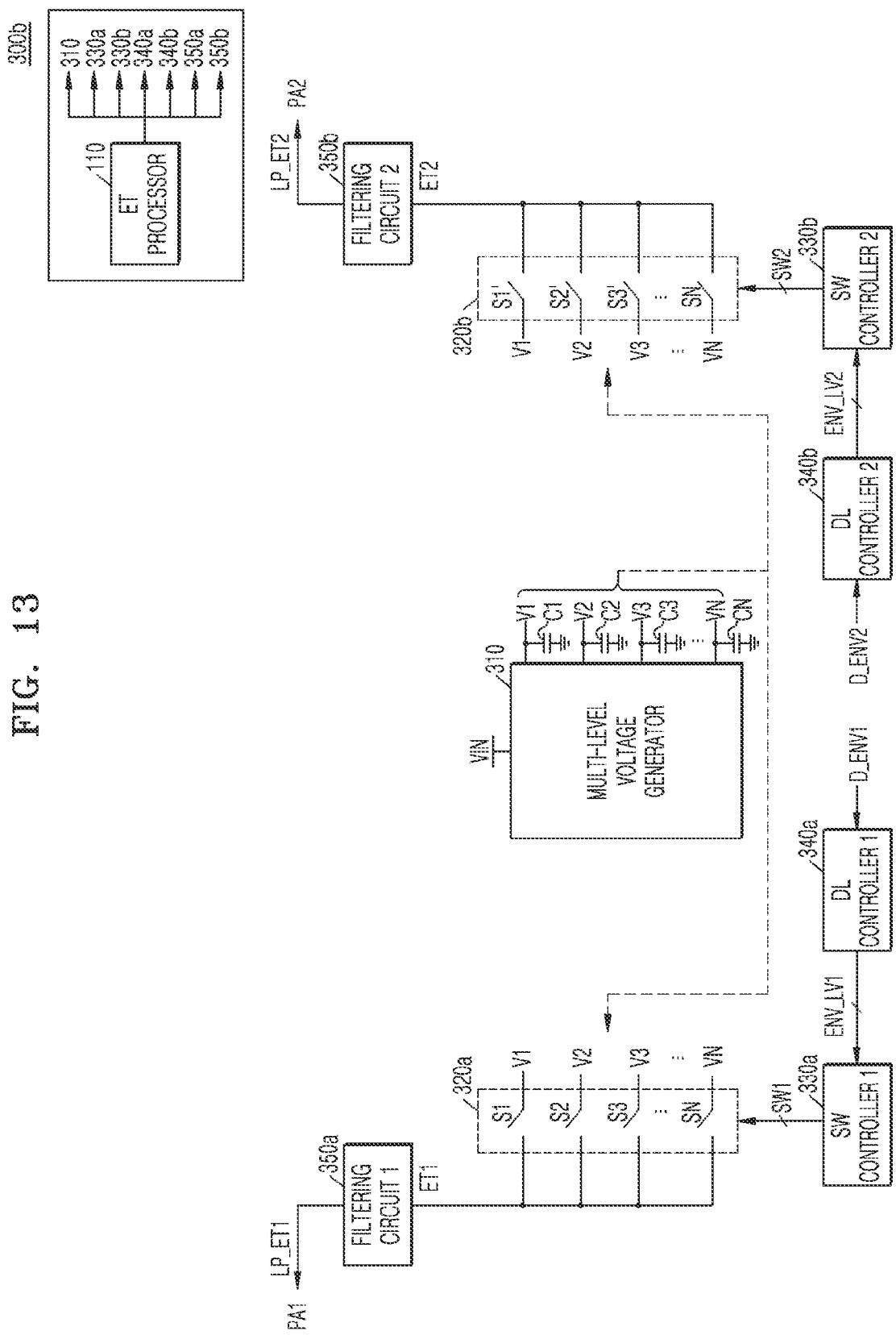
FIG. 13 is a circuit diagram illustrating an example in which a supply modulator of the present disclosure supplies a power voltage to a plurality of power amplifiers.
Figure 14:
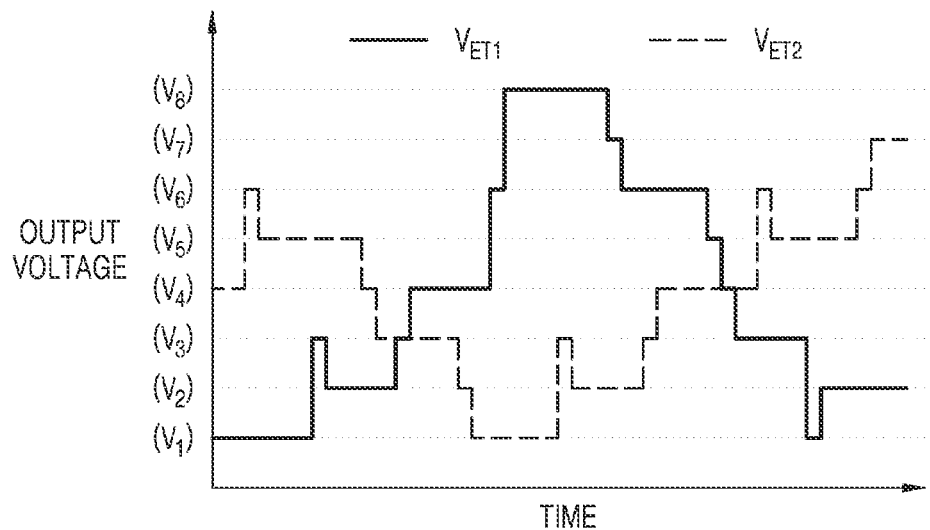
FIG. 14 is a graphical diagram illustrating a plurality of power voltages according to the example of FIG. 13.

FIG. 13 illustrates an example in which a supply modulator 300b of the present disclosure supplies a power voltage to a plurality of power amplifiers, and FIG. 14 illustrates a plurality of power voltages according to the example of FIG. 13.

Referring to FIG. 13, multiple levels of power voltages ET1 and ET2 may be generated by one multi-level voltage generator 310, and the supply modulator 300b may provide power voltages to different power amplifiers PA1 and PA2 by a plurality of switch arrays 320a and 320b. In more detail, in the case of the supply modulator 300b of FIG. 13, the power voltages ET1 and ET2 may be supplied to a plurality of power amplifiers (in the case of a plurality of power amplifiers in FIG. 1; e.g., first and second power amplifiers), respectively.

Accordingly, in the case of the supply modulator 300b of FIG. 13, the number of the switch array 320, the switch controller 330, the discrete level controller 340, and the filtering circuit 350 may be more than that of the supply modulator 300a of FIG. 2 by one. In addition, in the supply modulator 300b, the output capacitors C1 to CN connected to the multi-level voltage generator 310 are connected to both sides of the first and second power amplifiers PA1 and PA2, respectively, and thus, the output capacitors C1 to CN of the multi-level voltage generator 310 may be shared in generation operations of each of the first and second power voltages ET1 and ET2. Accordingly, the communications processor 100 may generate a reference output voltage signal for each of the first and second power voltages ET1 and ET2 in common and provide the reference output voltage signal to the multi-level voltage generator 310.

As such, in this embodiment, even when generating power voltages ET1 and ET2 for multiple power amplifiers, the number of output capacitors occupying a large proportion of a circuit area is the same as when generating power voltages for a single power amplifier, and thus, an increase in the circuit area may be minimized.

Referring to FIGS. 13 and 14, a first discrete level controller 340a and a second discrete level controller 340b may receive different digital envelope signals by the envelope tracking processor 110 to provide different level control signals ENV_LV1 and ENV_LV2 to switch controllers 330a and 330b, respectively. The first switch controller 330a and the second switch controller 330b may generate a first switch control signal SW1 and a second switch control signal SW2 for controlling opening/closing operations of the first switch array 320a and the second switch array 320b, respectively. Accordingly, the first switch array 320a and the second switch array 320b may provide multi-level power voltages having different waveforms to the first power amplifier PA1 and the second power amplifier PA2.

Figure 15:
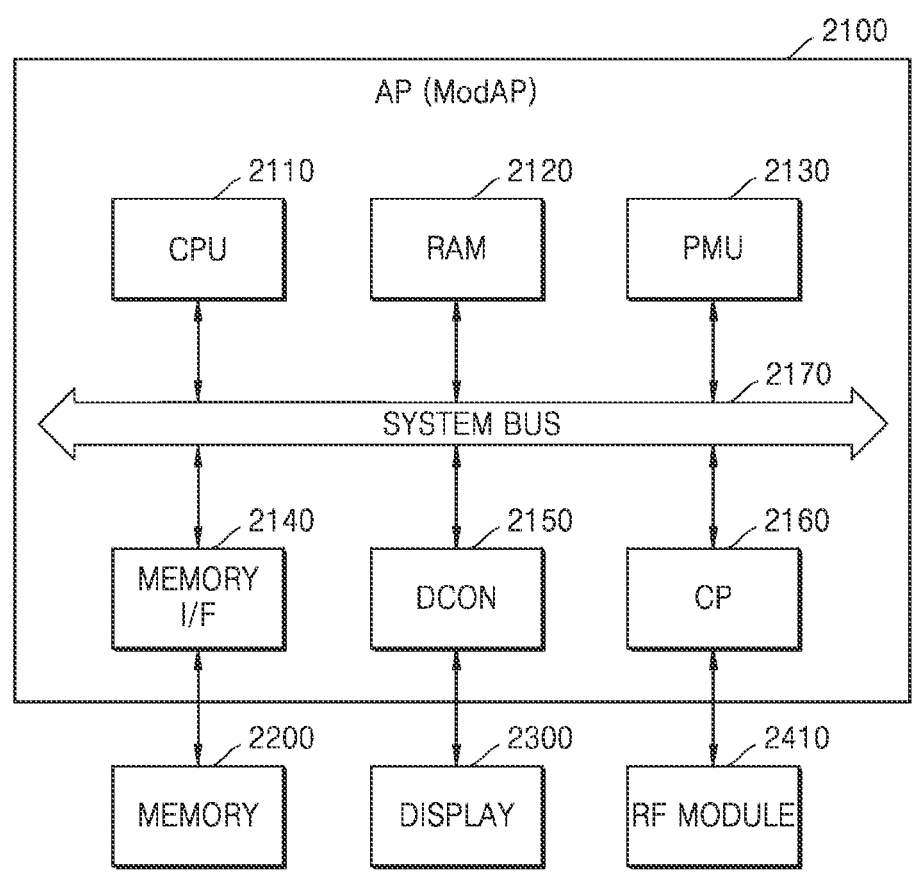
FIG. 15 is a block diagram of a wireless communications device including a supply modulator of the present disclosure.

FIG. 15 illustrates a wireless communications device 2000 including a supply modulator of the present disclosure.

Referring to FIG. 15, the wireless communications device 2000 may include an application processor (hereinafter referred to as an AP) 2100, a memory 2200, a display 2300, and an RF module 2410. In addition, the wireless communications device 2000 may further include various components such as a lens, a sensor, and an audio module.

The AP 2100 may be implemented as a system on a chip (SoC), and may include a central processing unit (CPU) 2110, random access memory (RAM) 2120, a power management unit (PMU) 2130, a memory interface (I/F) 2140, a display controller (DCON) 2150, a communications processor 2160, and a System Bus 2170. The AP 2100 may further include various intellectual properties (IPs). The AP 2100 may be referred to as a ModAP as functions of a communications processor chip are integrated therein.

The CPU 2110 may control operations of the AP 2100 and the wireless communications device 2000. The CPU 2110 may control the operation of each component of the AP 2100. In addition, the CPU 2110 may be implemented as a multi-core. The multi-core is one computing component with two or more independent cores.

The RAM 2120 may temporarily store programs, data, or instructions. For example, programs and/or data stored in the memory 2200 may be temporarily stored in the RAM 2120 according to the control of the CPU 2110 or booting code. The RAM 2120 may be implemented as dynamic random access memory (DRAM) or static RAM (SRAM).

The PMU 2130 may manage power of each component of the AP 2100. The PMU 2130 may also determine an operation state of each component of the AP 2100 and control the operation of the component.

The memory I/F 2140 may control operations of the memory 2200 and may control data exchange between each component of the AP 2100 and the memory 2200. The memory I/F 2140 may write or read data to or from the memory 2200 at the request of the CPU 2110.

The DCON 2150 may transmit image data to be displayed on the display 2300 to the display 2300. The display 2300 may be implemented as a flat panel display such as a liquid crystal display (LCD), an organic light emitting diode (OLED) display, or a flexible display.

For wireless communications, the communications processor 2160 may modulate data to be transmitted appropriately for a wireless environment and recover received data. The communications processor 2160 may perform digital communications with an RF module 2410.

For reference, the communications processor 100 described above with reference to FIG. 1 may be implemented in the communications processor 2160.

The RF module 2410 may convert a high frequency signal received through an antenna into a low frequency signal and transmit the low frequency signal to the communications processor 2160. In addition, the RF module 2410 may convert a low-frequency signal received from the communications processor 2160 into a high-frequency signal, and transmit the high-frequency signal to the outside of the wireless communications device 2000 through an antenna. In addition, the RF module 2410 may amplify or filter a signal.

For reference, in the RF module 2410, the RFIC 200, the supply modulator 300, the duplexer 400, the power amplifier 500, and the antenna ANT described above with reference to FIG. 1 may be implemented. Accordingly, the supply modulator described above with reference to FIGS. 4 to 15 may also be implemented in the RF module 2410.

For example, in the wireless communications device 2000, while broadband communications are supported, power consumption for communications may be reduced.

While the present disclosure has been particularly shown and described by way of example with reference to embodiments thereof, it will be understood by those of ordinary skill in the pertinent art that various changes in form and details may be made therein without departing from the spirit and scope of the present disclosure as set forth in the following claims.

What is claimed is:

1. A supply modulator comprising:
   a multi-level voltage generator configured to generate a plurality of power voltages having different voltage levels;
   a switch array including a plurality of switches respectively corresponding to the plurality of power voltages, each switch switchably connected to an output terminal; and
   a switch controller configured to receive a level control signal indicative of switching the connection to the output terminal from a first switch to a second switch, and to connect at least one third switch to the output terminal during a time period corresponding to a frequency to be attenuated between disconnecting the first switch and connecting the second switch.

2. The supply modulator of claim 1, wherein the frequency to be attenuated corresponds to a frequency of a transmission/reception signal of a power amplifier supplied with the power voltage.

3. The supply modulator of claim 1, wherein, when the frequency to be attenuated is changed, the switch controller activates the connection of the at least one of the third switches for a time period inversely proportional to the changed frequency to be attenuated.

4. The supply modulator of claim 1, wherein the switch controller activates the connection of the at least one of the third switches during different time periods according to a difference between a voltage of a first level corresponding to the first switch and a voltage of a second level corresponding to the second switch.

5. The supply modulator of claim 4, wherein, when a difference between the first level and the second level is an odd level, the switch controller
sequentially activates connection of a plurality of third switches corresponding to a plurality of voltage levels between the first level and the second level.

6. The supply modulator of claim 4, wherein, when a difference between the first level and the second level is an even level, the switch controller
activates connection of a third switch corresponding to an intermediate level between the first level and the second level.

7. The supply modulator of claim 1, further comprising:
a filtering circuit configured to cancel noise of the power voltage output from the switch array.

8. The supply modulator of claim 7, wherein the filtering circuit is activated when a Frequency Division Duplex (FDD) operation is performed and is deactivated when a Time Division Duplex (TDD) operation is performed.

9. A wireless communications device comprising:
a supply modulator configured to output one of a plurality of power voltages of different voltage levels, and to output a power voltage of at least one third voltage level distinguished from a first voltage level and a second voltage level when the power voltage is changed from the first voltage level to the second voltage level during a time period corresponding to a frequency to be attenuated between a change from the first voltage level to the second voltage level; and
a communications processor configured to control the supply modulator and determine at least one of the frequency to be attenuated and the time period.

10. The wireless communications device of claim 9, wherein the communications processor determines the time period according to the frequency to be attenuated corresponding to a frequency of a transmission/reception signal of a power amplifier to which the power voltage is supplied.

11. The wireless communications device of claim 9, wherein the supply modulator further comprises: a switch array including a plurality of switches corresponding to each voltage level, and outputting any one of the plurality of power voltages by activating connection of any one of the plurality of switches.

12. The wireless communications device of claim 11, wherein, when the frequency to be attenuated is changed, the supply modulator outputs the power voltage of the third voltage level during a time period inversely proportional to the changed frequency to be attenuated.

13. The wireless communications device of claim 11, wherein the supply modulator outputs the power voltage of the third voltage level during different time periods according to a difference between the first voltage level and the second voltage level.

14. The wireless communications device of claim 13, wherein the supply modulator outputs a plurality of third voltage levels between the first voltage level and the second voltage level when the difference between the first voltage level and the second voltage level is an odd level.

15. The wireless communications device of claim 13, wherein the supply modulator outputs an intermediate level between the first voltage level and the second voltage level as the third voltage level when the difference between the first voltage level and the second voltage level is an even level.

16. An operating method of a wireless communications device for amplifying power of a communications signal based on a plurality of levels of power voltages, the operating method including:
determining a transition delay time based on a frequency to be attenuated when the power voltages transition from a first level to a second level from among the plurality of levels;
outputting a power voltage of at least one third level distinguished from the first level and the second level during the transition delay time between transitioning from the first level to the second level; and
amplifying power of the communications signal based on the power voltage.

17. The operating method of claim 16, wherein the determining of the transition delay time comprises:
determining the frequency to be attenuated corresponding to a frequency of the communications signal; and
determining a time period inversely proportional to the frequency to be attenuated as the transition delay time.

18. The operating method of claim 16, wherein the determining of the transition delay time comprises:
determining the transition delay time based on a voltage difference between the first level and the second level.

19. The operating method of claim 18, wherein the outputting of the power voltage of the third level comprises:
outputting a plurality of voltage levels between the first level and the second level as a power voltage of the third level when the voltage difference between the first level and the second level is an odd level.

20. The operating method of claim 18, wherein the outputting of the power voltage of the third level comprises:
outputting a voltage level corresponding to an intermediate level between the first level and the second level as the power voltage of the third level when the voltage difference between the first level and the second level is an even level.

* * * * *